United States Patent
Lim et al.

[19]

[11] Patent Number: 6,104,965
[45] Date of Patent: *Aug. 15, 2000

[54] CONTROL OF WORKSTATIONS IN ASSEMBLY LINES

[75] Inventors: Ka Tiek Lim, Bayan Lepas; Hun Chiang Lim, Penang, both of Malaysia

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/846,451

[22] Filed: May 1, 1997

[51] Int. Cl.[7] ................................... G06F 19/00
[52] U.S. Cl. .............................. 700/112; 700/3; 700/115
[58] Field of Search ................. 422/67; 306/414; 235/462; 82/125; 72/336; 198/419.3, 341; 700/3, 112, 115; 29/783

[56] References Cited

U.S. PATENT DOCUMENTS

| | | | |
|---|---|---|---|
| 4,209,898 | 7/1980 | Akoi et al. | 29/783 |
| 4,428,505 | 1/1984 | Casey et al. | 222/64 |
| 5,104,621 | 4/1992 | Pfost et al. | 422/67 |
| 5,150,288 | 9/1992 | Imai et al. | 700/3 |
| 5,177,688 | 1/1993 | Rentschler et al. | 364/468 |
| 5,196,998 | 3/1993 | Fulton | 364/167.01 |
| 5,229,948 | 7/1993 | Wei et al. | |
| 5,390,104 | 2/1995 | Fulton | 364/167.01 |

*Primary Examiner*—William Grant
*Assistant Examiner*—Victoria Robinson
*Attorney, Agent, or Firm*—Dale W. Dorinski

[57] ABSTRACT

A workstation (1) in an assembly line for placing components onto workpieces is associated with a conveyor (3) for conveying the workpieces into and out of workstation (1). A component placer (6) places components from a component feeder (5) onto the workpieces. Controller (4) controls conveyor (3) and component placer (6) and determines placement operations for a workpiece. Information may be provided by a preceding workstation to controller (4) to determine the operations. When an idle status signal from a subsequent workstation is received, controller (4) determines information on how much of the operations have been executed or unexecuted by workstation (1). This information, associated with the workpiece, is then provided to the subsequent workstation when the workpiece is conveyed to the subsequent workstation. Thereafter, workstation (1) provides an idle status signal to the preceding workstation to request for another workpiece.

16 Claims, 2 Drawing Sheets

CONTROL OF WORKSTATIONS IN ASSEMBLY LINES

FIELD OF THE INVENTION

This invention relates to workstations for executing one or more operations on workpieces in assembly lines. In particular, this invention relates to, but is not necessarily limited by, workstations for placing components onto workpieces, such as circuit boards, in assembly lines.

BACKGROUND OF THE INVENTION

Conventionally, an assembly line includes workstations coupled to each other to execute various operations on workpieces. Typically, different workstations require different lengths of time to execute their respective operations on the workpieces. As a result, performance of one workstation can affect that of another workstation in the assembly line. For example, a workstation that requires a longer time to execute its operations on a workpiece will slow down preceding or subsequent workstations. This typically causes periods of inactivity particularly for a subsequent workstation which will be idle while waiting to receive a workpiece from the workstation. In addition to the above, output of workpieces of the assembly line is adversely affected when just one workstation is inoperable.

Assembly line balancing to minimize the periods of inactivity of workstations increases output of workpieces. Such line balancing includes scheduling workpieces for workstations as described in, for example, U.S. Pat. No. 5,229,948 which discloses a method for optimizing a serial manufacturing system based on characteristics and status of workstations. In the method of U.S. Pat. No. 5,229,948, buffers are used for temporary storage of workpieces for workstations. However, buffers are not always appropriate, as for example, in an assembly line for component placement of circuit boards. This is because buffers increase a time period between component placement and reflowing. As a result, solder paste applied to the boards may be too dry if the time period is too long. Furthermore, a large number of workpieces in a buffer for a workstation is typically reduced by slowing down or even temporarily stopping a preceding workstation in executing operations.

SUMMARY OF THE INVENTION

It is an object of this invention to overcome or alleviate the limitations associated with workstations for executing one or more operations on workpieces in assembly lines.

According to one aspect of the invention, there is provided a workstation comprising executing means for executing one or more operations on a workpiece, a conveyor for conveying the workpiece, and a controller coupled to control the executing means and the conveyor. The conveyor is associated with the executing means. The controller is adapted to control the executing means to reduce the operations in response to an idle status signal and, thereafter, control the conveyor to convey the workpiece out of the workstation.

BRIEF DESCRIPTION OF THE DRAWINGS

In order to describe the invention and to put it into practical effect, reference will now be made to a preferred embodiment as illustrated with reference to the accompanying drawings in which.

DETAILED DESCRIPTION OF THE INVENTION

Figure 1:
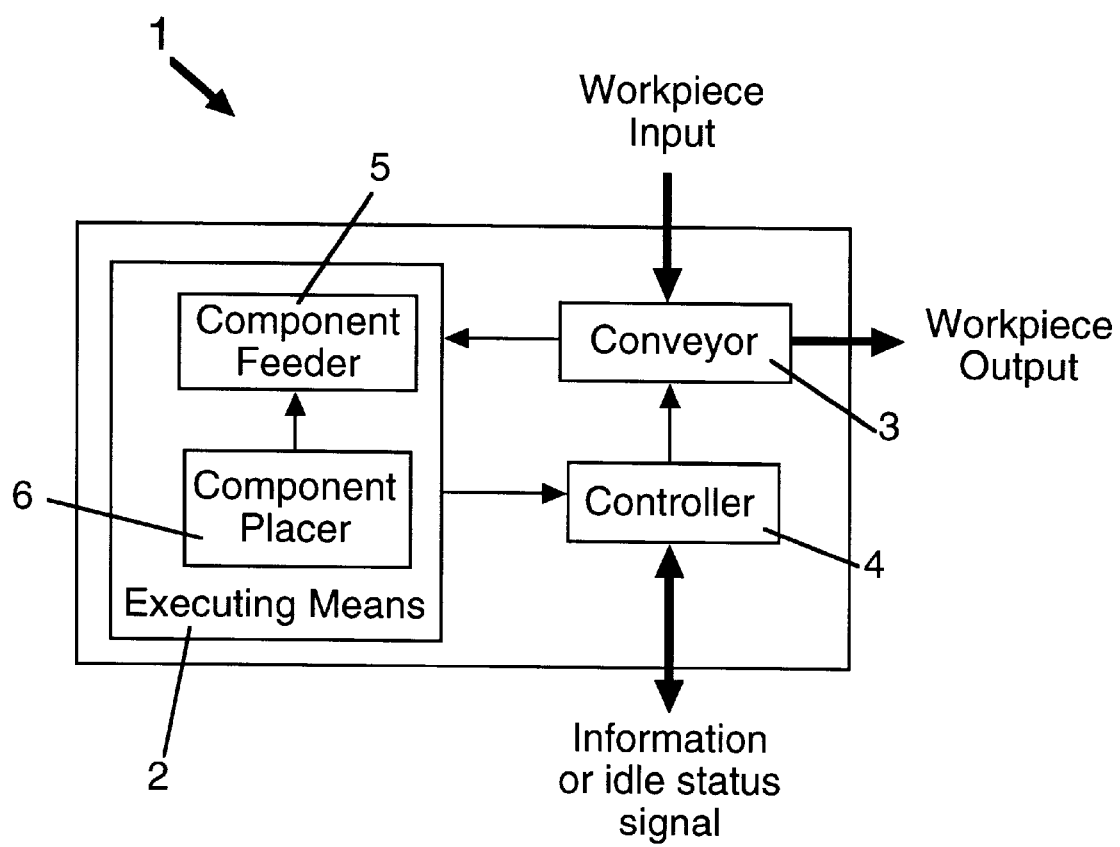
FIG. 1 shows a block diagram of a workstation in accordance with a preferred embodiment of the invention.

FIG. 1 shows a block diagram of a workstation 1 in accordance with a preferred embodiment of the invention. The workstation 1 comprises executing means 2, a conveyor 3 and a controller 4. Executing means 2 includes a component feeder 5 and a component placer 6. Controller 4 couples to control executing means 2 and conveyor 3. Conveyor 3 is associated with executing means 2 and conveys workpieces from a preceding workstation (not shown) to workstation 1 or from workstation 1 to a subsequent workstation (not shown). The preceding or subsequent workstations need not be next in sequence with workstation 1. For example, there may be one or more intermediate workstations between the preceding workstation and workstation 1.

Controller 4 determines one or more operations for executing by executing means 2. In this preferred embodiment, the operations are placement operations in which component placer 6 places components from component feeder 5 onto workpieces. Information associated with the workpiece may be provided to controller 4 by the preceding workstation to determine the operations. Controller 4 can reduce these operations by controlling executing means 2 in response to an idle status signal from the subsequent workstation. The idle status signal indicates to controller 4 that the subsequent workstation is ready to accept a workpiece from workstation 1. Controller 4 also provides information on executed or unexecuted operations for the workpiece to the subsequent workstation.

The invention advantageously executes operations on workpieces with workstation 1 depending on how many of the operations have been executed or unexecuted by preceding workstations. Furthermore, the operations of workstation 1 can also be executed by subsequent workstations depending on availability of the subsequent workstations to execute the operations. An assembly line having two or more workstation 1 coupling together can attain a dynamic line balance with a minimum use of buffers. Hence, unlike prior art assembly lines that controls buffers or slows down workstations for line balancing, workstation 1 in the invention continuously execute operations without slowing down or stopping because of performance of other workstations.

Figure 2:
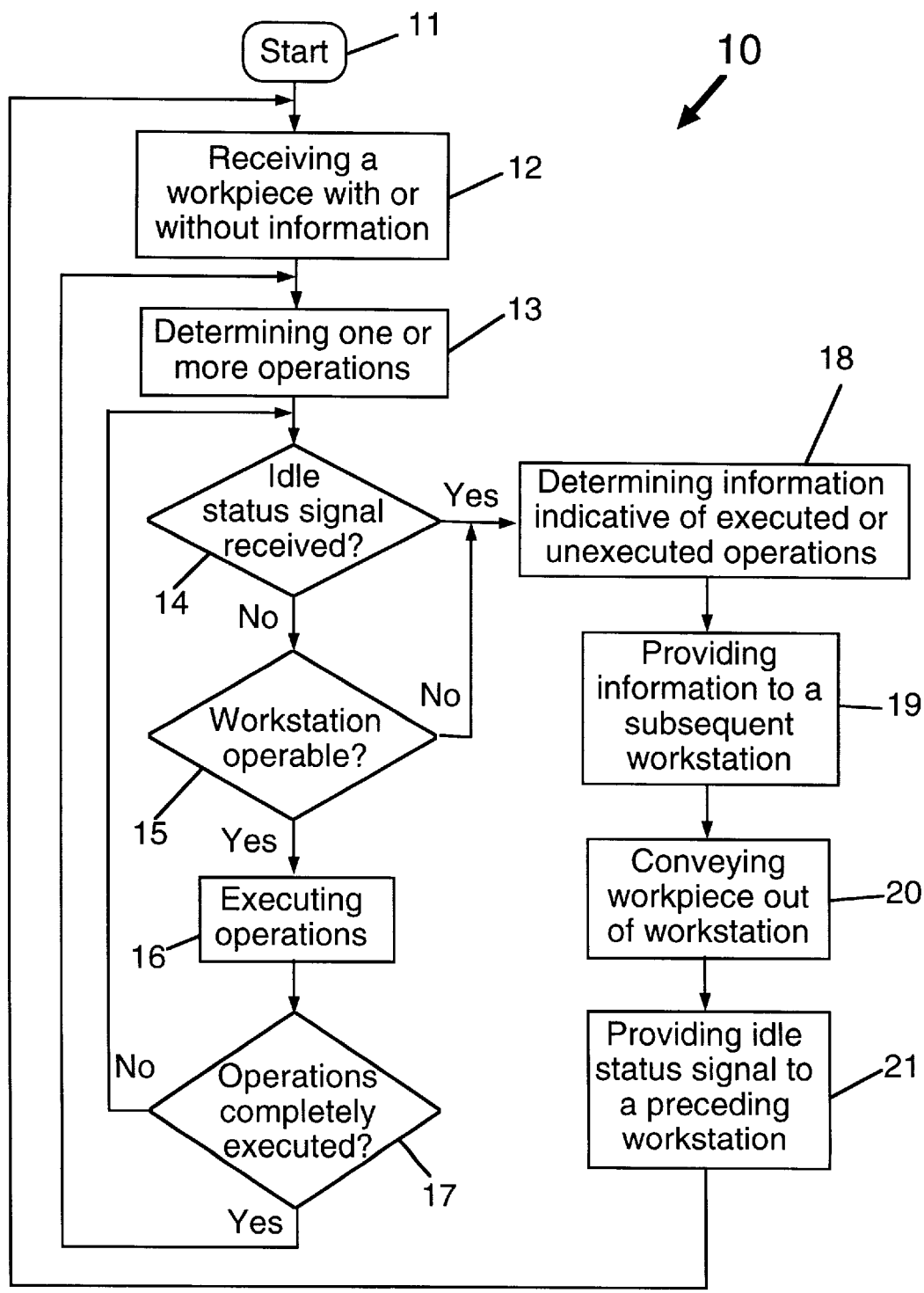
FIG. 2 is a flow diagram of a method for operating the workstation of FIG. 1.

FIG. 2 is a flow diagram of a method 10 for operating workstation 1. The method 10 starts at step 11 and continues with workstation 1 receiving a workpiece at step 12 from a preceding workstation. At step 13, controller 4 determines one or more operations for the workpiece. In determining the operations for the workpiece, information on the workpiece may be provided to controller 4 by the preceding workstation. At step 14, controller 4 monitors for presence of an idle status signal. The idle status signal is provided by a subsequent workstation that is requesting for the workpiece. When the idle status signal is not present, the method 10 continues with controller 4 checking at step 15 if workstation 1 is operable to execute the operations determined at step 13.

When workstation 1 is operable, controller 4 controls executing means 2 in executing the operations at step 16. Otherwise, when workstation 1 is inoperable, controller 4 determines information of executed or unexecuted operations for the workpiece at step 18. This information is then provided to a subsequent workstation at step 19 and is associated with the workpiece when conveyed at step 20 to the subsequent workstation.

Following step 16, controller 4 periodically checks whether the operations are completely executed at step 17. From step 17 and when the operations are not completely executed, method 10 goes to step 14 at which controller 4 monitors for the idle status signal. Otherwise, when the operations are completely executed, method 10 goes to step 13 at which one or more operations are determined for the workpiece again. Following this step 13, the method 10 repeats steps for the workpiece depending on whether the idle status signal is received from the subsequent workstation.

When the idle status signal is received at step 14 and the workpiece has unexecuted operations, controller 4 at step 18 determines information on either the unexecuted operations or executed operations. This information is then associated with workpiece when provided at step 19 to the subsequent workstation. The workpiece is also conveyed at step 20 the subsequent workstation.

At step 21, workstation 1 provides an idle status signal to a preceding workstation. This preceding workstation can be executing operations similar to workstation 1 or merely providing workpieces to workstation 1.

Advantageously, workstations in accordance with the invention provide dynamic line balancing of output for an assembly line. In particular, different lengths of time needed by the workstations to execute operations are balanced in the assembly line by variably executing the operations depending on workstation status such as availability and operability. Furthermore, each workstation in the invention can support any other workstation so that output of workpieces is continuous even when only one workstation is operable. Thus, the invention can be effectively applied in, for example, component placement of circuit boards to thereby minimize storage of workpieces in buffers and also reduce the time period between component placement and reflowing.

Although this invention has been described with reference to a preferred embodiment, it is to be understood that this invention is not limited to the specific embodiment described herein.

We claim:

1. A system for controlling multiple workstations in an assembly line, comprising:

a plurality of independent workstations coupled to each other by a conveyor, each workstation having an executing means for executing one or more operations on a workpiece and having a controller coupled to the executing means and the conveyors; and wherein the controller of one of the plurality of workstations is adapted to control the executing means in that workstation to reduce said one or more operations in response to an idle status signal received from the controller of a subsequent workstation, and to communicate an idle status signal to the controller of a preceding workstation, and to control the conveyor to convey the workpiece to the subsequent workstation to complete a remainder of said reduced operations on the workpiece.

2. The system of claim 1, wherein said controller of one of the plurality of workstations is adapted to determine information indicative of unexecuted operations of said reduced operations and provide said information to at least one subsequent workstation.

3. The system of claim 1, wherein said controller of one of the plurality of workstations is adapted to determine information indicative of executed operations of said reduced operations and provide said information to at least one subsequent workstation.

4. The system of claim 1, wherein said controller of one of the plurality of workstations communicates an idle status signal to at least one preceding workstation when said workpiece is conveyed out of the workstation.

5. The system of claim 1, wherein when said workstation is inoperable, said controller is adapted to provide an idle status signal to at least one preceding workstation.

6. A method for controlling a workstation in an assembly line having a plurality of workstations in communication with each other, said method comprising the steps of:

receiving a workpiece from a preceding workstation;

determining one or more operations to be performed on said workpiece;

reducing the extent of said one or more operations in response to a signal received from a subsequent idle workstation; and transferring said workpiece to said subsequent idle workstation in order to perform at least a portion of said reduced operations.

7. The method of claim 6, wherein said step of reducing further comprises the steps of:

determining information indicative of unexecuted operations of said one or more operations; and providing said information to at least one subsequent workstation.

8. The method of claim 6, wherein said step of reducing further comprises the steps of:

determining information indicative of executed operations of said one or more operations; and providing said information to at least one subsequent workstation.

9. The method of claim 6, further comprising the step of providing an idle status signal to at least one preceding workstation when said workpiece is transferred out of said workstation.

10. The method of claim 6, further comprising the step of receiving information from said preceding workstation to determine said one or more operations.

11. The method of claim 6, further comprising the step of providing, when said workstation is inoperable, an idle status signal to at least one preceding workstation.

12. A placement workstation comprising:

a component placer for executing one or more placement operations on a workpiece;

a conveyor for conveying said workpiece, said conveyor being associated with said component placer; and a controller coupled to control said component placer and said conveyor, wherein said controller is adapted to control said component placer to reduce said one or more placement operations in response to an idle status signal communicated from a preceding workstation and, thereafter, to control said conveyor to convey said workpiece out of said placement workstation.

13. The placement workstation of claim 12, wherein said controller is adapted to determine information indicative of executed or unexecuted operations of said one or more placement operations and provide said information to at least one subsequent placement workstation.

14. The placement workstation of claim 12, wherein said controller is adapted to provide an idle status signal to at least one preceding placement workstation when said workpiece is conveyed out of said placement workstation.

15. The placement workstation of claim 14, wherein said controller is further adapted to receive information from said preceding placement workstation, said information being for said controller to determine said one or more placement operations.

16. The placement workstation of claim 12, wherein when said placement workstation is inoperable, said controller is adapted to provide an idle status signal to at least one preceding placement workstation.

* * * * *